United States Patent [19]

Okayama et al.

[11] Patent Number: 5,493,125
[45] Date of Patent: Feb. 20, 1996

[54] CHARGED BEAM APPARATUS

[75] Inventors: Shigeo Okayama; Mutsuo Ogura, both of Tsukuba; Masanori Komuro, Ryugasaki; Hiroshi Hiroshima, Tsukuba, all of Japan

[73] Assignee: Agency of Industrial Science and Technology, Tokyo, Japan

[21] Appl. No.: 206,161

[22] Filed: Mar. 7, 1994

[30] Foreign Application Priority Data

Mar. 25, 1993 [JP] Japan .................................. 5-090792

[51] Int. Cl.⁶ .................................................. H01J 37/20
[52] U.S. Cl. ................................ 250/441.11; 250/442.11
[58] Field of Search ....................... 250/440.11, 441.11, 250/442.11, 358

[56] References Cited

U.S. PATENT DOCUMENTS

| | | | |
|---|---|---|---|
| 3,426,193 | 2/1969 | Guernet | 250/442.11 |
| 3,787,696 | 1/1974 | Dao | 250/397 |
| 3,939,353 | 2/1976 | Shirai | 250/441.11 |
| 4,524,261 | 6/1985 | Petric et al. | 250/441.11 |
| 4,560,880 | 12/1985 | Petric et al. | 250/441.11 |
| 4,584,479 | 4/1986 | Lamattina et al. | 250/441.11 |
| 4,818,838 | 4/1989 | Young | 250/441.11 |
| 4,833,362 | 5/1989 | Crewe | 313/7 |
| 5,093,578 | 3/1992 | Tappel et al. | 250/441.11 |

FOREIGN PATENT DOCUMENTS 60-89922  5/1985  Japan .
2-139842  5/1990  Japan .

*Primary Examiner*—Bruce C. Anderson

[57] ABSTRACT

A charged beam apparatus comprising a vacuum chamber having a moving mechanism inside and a sample chamber, the sample chamber being used placed in an ultra-high vacuum atmosphere or a gas atmosphere, wherein a flat surface is formed on that surface of the moving mechanism which faces the sample chamber, and a flange having a flat open surface is mounted between the vacuum chamber and the sample chamber such that the open surface is opposed to the flat surface with a tiny gap being formed between the open surface and the flat surface for permitting vacuum venting without imposing any restrictions on the moving mechanism, whereby the apparatus operates without restricting the action of the moving mechanism.

6 Claims, 3 Drawing Sheets

CHARGED BEAM APPARATUS

BACKGROUND OF THE INVENTION

1. Field of the Invention

The present invention relates to a charged beam apparatus using a charged beam such as an electron beam or ion beam, including a lithography device for applying intricate beam fabrication on a sample to be worked, or for forming a fine pattern on the substrate of a semiconductor, or a sample analyzer for analyzing and assessing samples.

2. Description of the Prior Art

In processing technologies using a charged beam, intended for applying a fine electronic circuit pattern to the substrate of a semiconductor, or for applying fine beam fabrication on a sample to be worked, charged beam devices with a built-in sample moving mechanism capable of highly accurate beam and sample position control are essential. Upgraded performance and function are vital for these charged beam devices, because they govern the characteristics of samples prepared.

A charged beam apparatus requiring an ultra-high vacuum sample chamber adopts a method which mounts an aperture with a tiny hole diameter at the interface between the sample chamber and a high-vacuum charged beam optical column to perform differential venting. With such a conventional apparatus, vacuum characteristics differ according to the structures, materials, gas release characteristics, surface treatment techniques, etc. of or for the various functional devices incorporated in the ultra-high vacuum chamber. Hence, it is difficult to achieve both an ultra-high vacuum and high performance in a complicated, highly accurate moving mechanism incorporated in the vacuum chamber.

For the realization of an ultra-high vacuum of $10^{-7}$ Pa or less, in particular, it is indispensable to reduce the surface areas of the structures within the chamber as well as the internal surfaces of the chamber. For this purpose, it is crucial to planish or surface-treat the internal surfaces of the chamber or the surfaces of the structures and to constitute these structures and internal surfaces from materials involving minimal gas release.

Normally, the moving mechanism uses a sliding guide or a rolling guide, and thus inevitably requires a lubricant for the guide surface. However, a lubricant entails gas release under a vacuum and is far from satisfactory, thus making its use in an ultra-high vacuum difficult. A non-lubricating moving mechanism with a coating or the like, on the other hand, causes a stick-slip under an ultra-high vacuum, making precision driving difficult. In order to attain an ultra-high vacuum, moreover, moisture adsorbed onto the surfaces of the structures within the chamber must be evaporated and exhausted, making a bake at about 120°–200° C. essential. All of this poses difficulty in using a high-accuracy moving mechanism under an ultra-high vacuum.

In a semiconductor lithography apparatus with strict requirements for fine fabrication and high accuracy, in particular, a highly stable, highly accurate laser interference comparator system is incorporated for real-time management of the sample position and the positional coordinate of the illuminating beam. A mirror as a reference and an interferometer that are used with such an apparatus have their inherent temperature coefficients, and are sensitive to temperature changes. Thus, baking which greatly changes the ambient temperature is a major factor to induce decline in the comparator accuracy. An electron beam writing device and a focused ion beam device have a built-in XY stage for making a high-accuracy sample movement. However, this XY stage poses the problem, in vacuum evacuation, of an increased surface area ascribed to its complicated structure. Moreover, gas release due to the vaporization of a lubricating oil used for a rolling bearing, etc. makes the use of these devices under an ultra-high vacuum difficult.

With gas-assisted etching or deposition with a charged beam, a gas, such as active chlorinous gas or organometallic gas, is introduced into the chamber, thus posing the problem of whether the internal surfaces of the chamber and structures incorporated in the chamber are corrosion resistant or not.

As described above, much difficulty is involved in using conventional techniques to achieve an ultra-high vacuum and the use of a sample chamber and an optical column resistant to corrosive gas in the vicinity of an ordinary high vacuum portion.

FIG. 1 shows the structure of an electron beam writing device, an example of the charged beam apparatus according to conventional technology. In the drawing, the reference numeral 1 denotes an electron-optical column constituting an electron beam optical system. The numeral 11 is an electron gun for generating a high-intensity electron beam. The numerals 12, 13, 14 are each an electron lens for focusing the electron beam into a desired shape. The numeral 15 is a blanking system for ON-OFF control of the electron beam. The numeral 16 is a deflector for deflecting and scanning the electron beam. The numerals 17, 18 are each a pump for venting the electron-optical column to a vacuum.

Furthermore, the numeral 2 is a sample chamber for accommodating a substrate to be worked. The numeral 21 is a holder for holding a sample in place. The numeral 22 is a sample moving mechanism for moving the sample to a desired position. The numeral 23 is a laser interference mirror which serves as a reference for measuring the sample position or beam position. The numeral 24 is a laser interferometer. The numeral 25 is a wavelength stabilizing laser. The numeral 26 is a receiver for laser interference measurement. The numeral 27 is a motor for driving the sample stage from outside the vacuum. The numeral 28 is a vacuum venting pump for the sample chamber. This structural diagram omits an illustration of a chamber for sample replacement.

Compared with a conventional electron beam writing technique which writes a fine pattern on an organic resist to form a mask pattern, patterning on an inorganic resist enables finer pattern formation and purer treatment. With such patterning on an inorganic resist, a cleaning technique for preventing contamination due to oxidation or gas adsorption of the surface of the substrate to be worked becomes important. In this unprecedented aspect, development of a lithographic technology employed under an ultra-high vacuum is of importance. In gas-assisted etching or deposition with a charged beam, devices provided with an anti-corrosion measure for the chamber and structures incorporated therein are indispensable for pattern formation on the clean surface by introduction of an active chlorinous gas or an organometallic gas.

SUMMARY OF THE INVENTION

This invention is characterized by providing a charged beam apparatus having a chamber of an ultra-high vacuum or with a gas introducing mechanism or the like, in which a chamber for performing treatment in a clean environment or high grade gas processing and a chamber equipped with a high-accuracy sample moving mechanism and a similar high grade mechanism are separated from each other with a vacuum maintained, thereby realizing the maintenance of an ultra-high vacuum, a goal difficult to attain, or the reduction of damage to structures within the chamber attendant on gas introduction.

The charged beam apparatus of the present invention is designed to separate either chambers with different degrees of vacuum from each other, or a vacuum chamber and a gas introducing chamber from each other, to permit differential venting. For this purpose, the invention is characterized in that a flange having an opening is mounted on one of the chambers, and a flat surface for covering the range of movement is formed in a moving mechanism within the other chamber facing the flange surface, whereby a tiny gap is maintained between the open flange portion of the chamber and the flat surface of the moving mechanism, so that the venting conductance is made small by the tiny gap, thus realizing venting between the chambers with different degrees of vacuum and the driving of the moving mechanism at the same time.

That is, the charged beam apparatus of the present invention comprises a vacuum chamber having a moving mechanism inside and a sample chamber and is adapted to irradiate a charged beam to a sample in the sample chamber, wherein a flat surface is formed on that surface of the moving mechanism which faces the sample chamber, and a flange having a flat open surface is mounted between the vacuum chamber and the sample chamber such that the open surface is opposed to the flat surface with a tiny gap being formed between the open surface and the flat surface for permitting vacuum venting without imposing any restrictions on the moving mechanism.

The construction of the invention may be such that the sample chamber is placed under an ultra-high vacuum or in a gas atmosphere.

In a differential venting system which maintains two adjacent vacuum chambers at different degrees of vacuum, it has been customary practice to maintain the degrees of vacuum of the respective chambers by connecting the vacuum chambers together via orifices having tiny apertures. In this case, the degree of vacuum of the chamber on the higher vacuum side is determined by the degree of vacuum of the adjoining chamber and the vacuum conductance of the orifice on the lower vacuum side, as well as by the volume, gas release, venting capacity and leak of a vacuum pump on the higher vacuum side.

According to the present invention, an open flange having a flat surface is mounted between an adjoining charged beam optical column or a chamber attached to it and an adjoining chamber having a sample moving mechanism and a similar mobile mechanism such that the open flange and the flat surface of the moving mechanism are opposed to each other with a tiny gap provided therebetween to make the venting conductance small and realize differential venting between the two chambers. Consequently, structures, such as a sample moving mechanism, which are difficult to heat or maintain under an ultra-high vacuum or a gas atmosphere because of complicated construction or the requirement for a high accuracy, can be disposed within a chamber with an ordinary degree of vacuum of about $10^{-5}$ Pa or more, and there will be no losses in the accuracy or characteristics of the moving mechanism.

There has been a conventional device in which a moving mechanism and an ultra-high vacuum system are connected via a bellows in an attempt to solve, at the same time, the problem of vacuum maintenance and the problem of maintaining the performance of the moving mechanism. However, such a device is not suitable for a semiconductor lithography apparatus aiming at fine, high-accuracy pattern formation or for a resolution-oriented apparatus for analysis and assessment, such as a microscope, because the deformation of the bellows, vibrations, etc. decrease the positioning accuracy of the moving mechanism.

In the present invention, by contrast, the two chambers with different degrees of vacuum are separated physically by a tiny gap, thus making it possible to avoid a positional deviation due to deformation as encountered with the bellows, and to avoid influences associated with the driving of the moving mechanism or external vibrations. In the present invention, moreover, when the inside of the chamber is to be vented, the gap between the flat surfaces can be enlarged from outside the vacuum chamber and used as a vacuum venting port, thus simplifying the structure of the venting system and facilitating the control of the venting system.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Embodiment 1

The embodiment of the present invention will be described with reference to the appended drawings.

Figure 1:
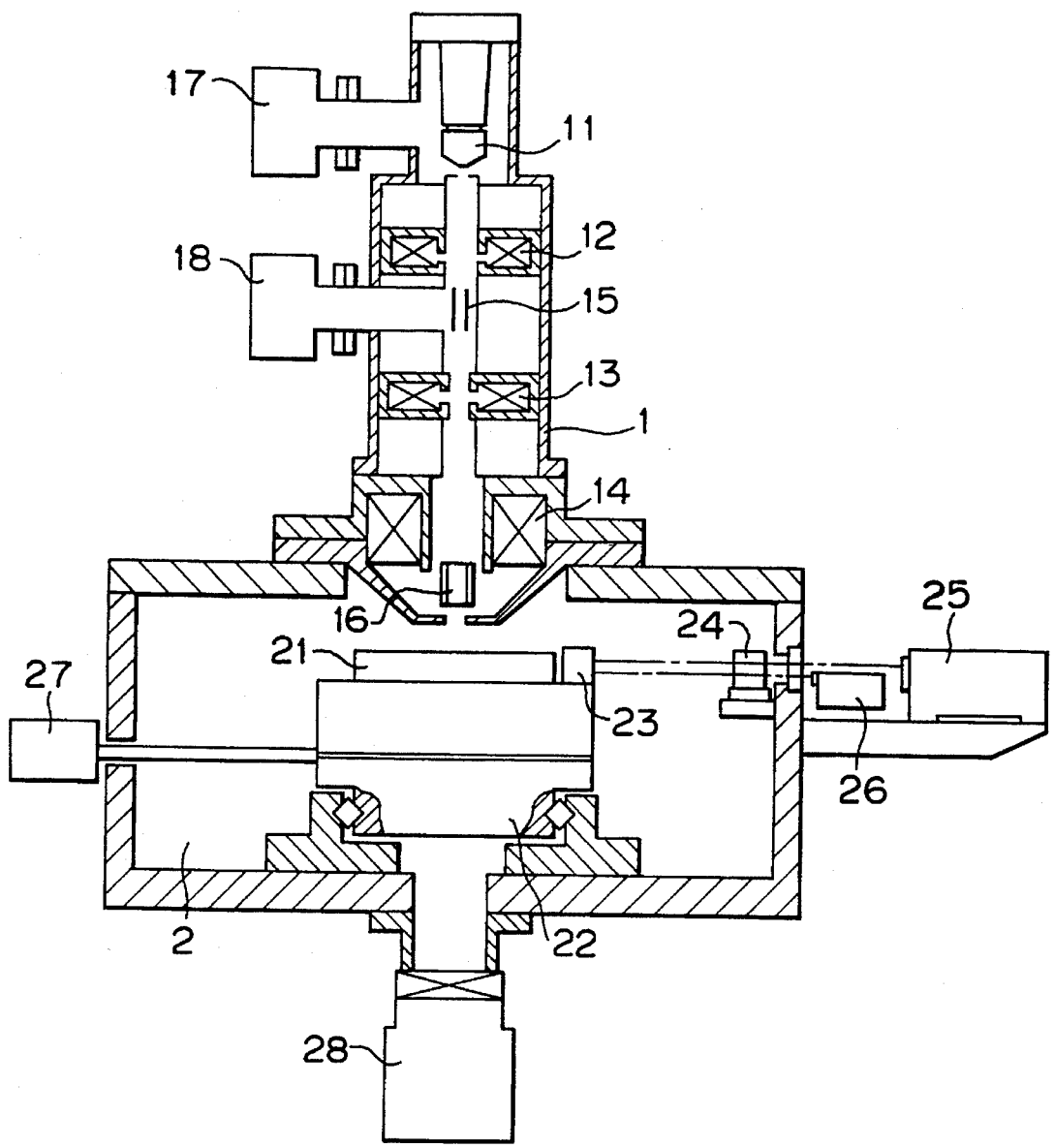
FIG. 1 is a sectional constructional diagram showing an electron beam writing device as a charged beam apparatus according to conventional technology.
Figure 2:
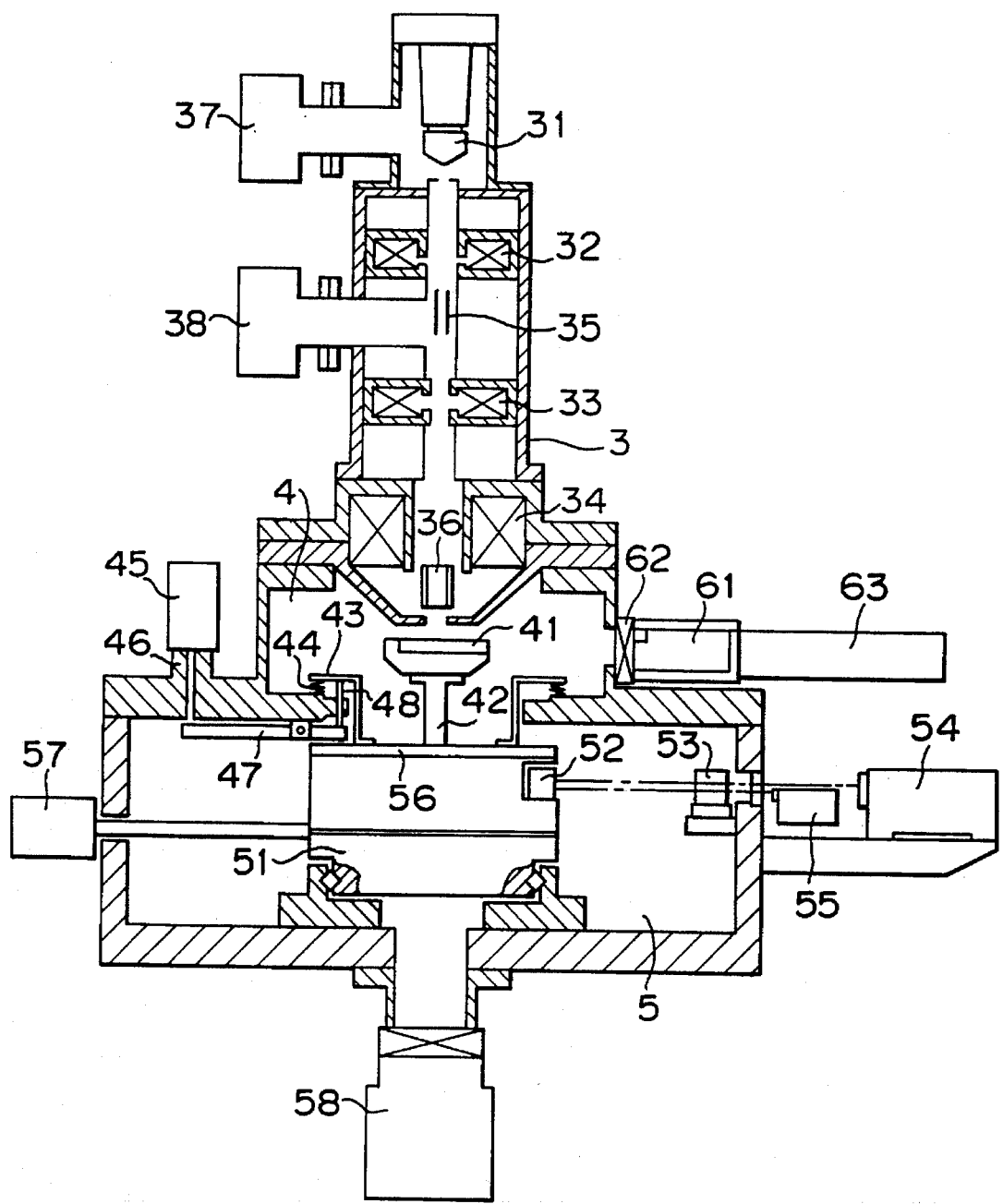
FIG. 2 is a sectional constructional diagram showing an electron beam writing device, one of the embodiments according to the present invention.

FIG. 2 shows the structure of an electron beam writing device, one of the embodiments according to the present invention. This device has a sample chamber capable of an ultra-high vacuum and gas introduction.

In the drawing, the reference numeral 3 denotes an electron-optical column constituting an electron beam optical system. The numeral 31 is an electron gun for generating a high-intensity electron beam. The numerals 32, 33, 34 are each an electron lens for focusing the electron beam into a desired shape. The numeral 35 is a blanking system for performing the ON-OFF control of the electron beam. The numeral 36 is a deflector for deflecting and scanning the electron beam. The numerals 37, 38 are each a pump for venting the electron-optical column to a vacuum.

Furthermore, the numeral 41 is a sample chamber for accommodating a substrate to be worked, the sample chamber being adapted to introduce an ultra-high vacuum or a gas. The numeral 5 is a stage chamber which is connected communicatingly with the sample chamber 4 and has a structure such as a sample moving mechanism. The numeral 41 is a holder for holding a sample in place. The numeral 42 is a shaft for linking the sample holder 41 to a sample moving mechanism 51 to be described (XY stage). The numeral 43 is a sleeve which is mounted on a connection portion between the sample chamber 4 and vacuum chamber 5 and has an open flange having a flat surface opposed to the top surface of the sample moving mechanism. The numeral 44 is a bellows. The numeral 45 is an actuator, such as motor, for controlling the distance of a tiny gap 50 to be described with reference to FIG. 3. The numeral 46 is an introducing mechanism for transmitting the amount of driving by the actuator 45 into the vacuum. The numeral 47 is a transmitting mechanism for transmitting the amount of driving in a decreased state to the position of driving. The numeral 48 is a shaft for transmitting the motion of the transmitting mechanism 47 to the open flange of sleeve 43.

To the stage chamber 5 are mounted a laser interference mirror 52 and a laser interferometer 53 which serve as a laser interference unit for detecting the sample position and the relative position of the XY stage 51 and the electron beam. The numeral 54 is a wavelength stabilizing laser. The numeral 55 is a receiver for laser interference measurement. The numeral 56 is a flange surface of the sample moving mechanism 51 for forming a tiny gap by being opposed to the open flange of sleeve 43. The numeral 57 is a motor for driving the sample moving mechanism 51 from outside the vacuum. The numeral 58 is a venting vacuum pump for the stage chamber 5. The numeral 61 is a sub-chamber for sample replacement. The numeral 62 is a gate valve for separating the sample chamber 4 and the sub-chamber 61. The numeral 63 is a sample replacing mechanism. This constructional diagram omits a vibration-removing frame for decreasing external vibrations, a controlling electronic mechanism, a vacuum venting pump for the sample chamber and the sample replacing sub-chamber, etc.

Figure 3:
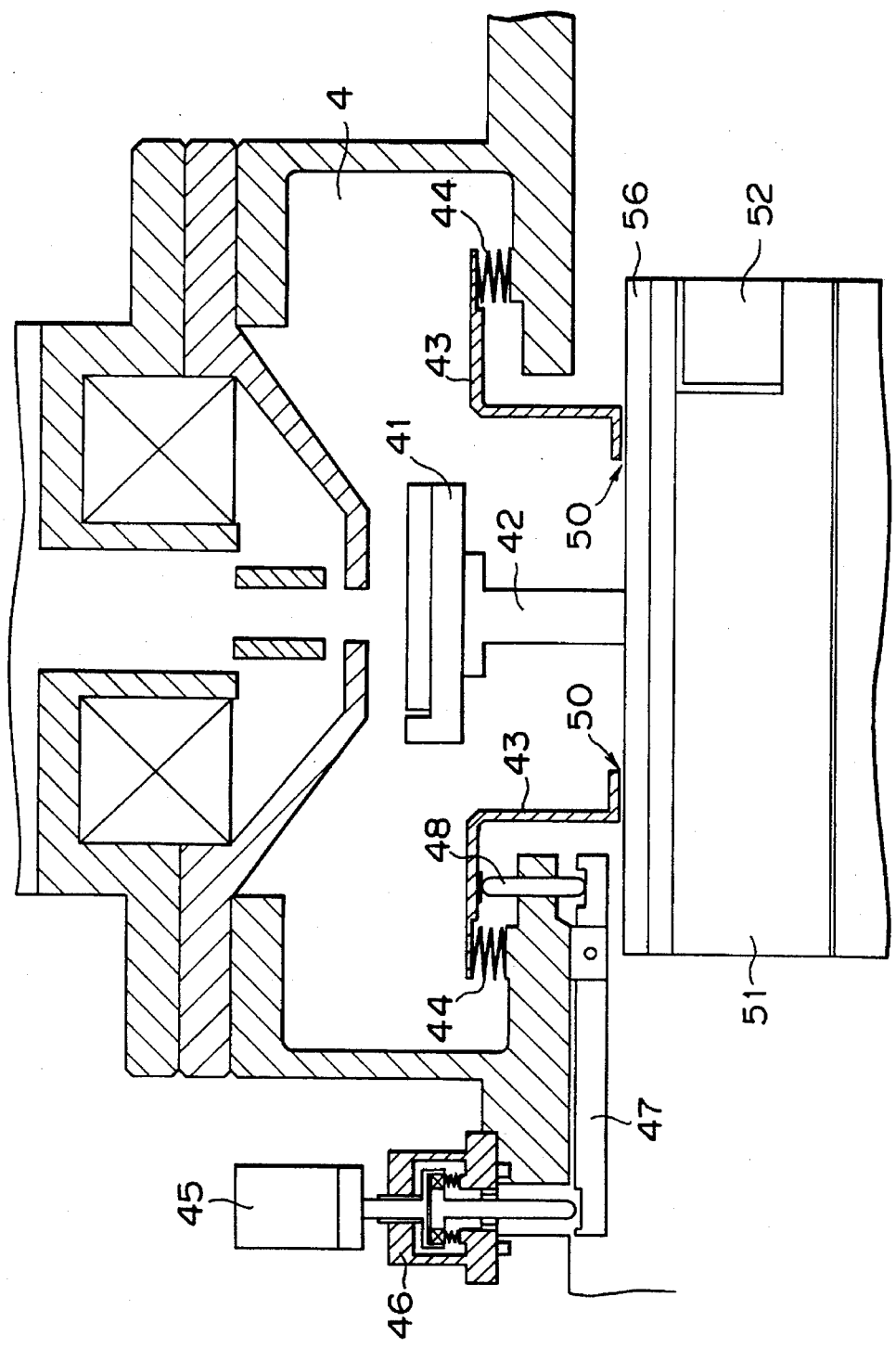
FIG. 3 is an enlarged, sectional, constructional diagram showing the surroundings of the tiny gap between chambers of the device according to the embodiment illustrated in FIG. 2.

FIG. 3 shows a constructional diagram, on an enlarged scale, of the sample chamber 4 where the sample holder 41 is present, and the stage chamber portion where the sample moving mechanism 51 is disposed, in the embodiment illustrated in FIG. 2.

As is clear from FIG. 3, the sample chamber 4 and the stage chamber 5 are separated by the gap 50 between the open flange of sleeve 43 and the flange surface 56 of the sample moving mechanism 51 in terms of vacuum venting. Since the open flange of sleeve 43 and the sample chamber 4 are connected by the bellows 44, the position of the open flange of sleeve 43 relative to the flange surface 56 can be adjusted. In the instant embodiment, a mechanism for adjusting the distance of the tiny gap 50 from outside the vacuum is mounted. This mechanism comprises the actuator 45, such as motor, for controlling the distance of the tiny gap 50, the introducing mechanism 46 for transmitting the amount of driving by the actuator 45 into the vacuum, the transmitting mechanism 47 for transmitting the amount of driving in a decreased state to the position of driving, and the shaft 48 for transmitting the motion of the transmitting mechanism 47 to the open flange of sleeve 43. A spring mechanism or the like for pressing the flange surface downward is omitted.

Although not shown in FIG. 3, the distance of the tiny gap 50 can be directly measured and controlled by a gap sensor or the like which is in common use. A highly accurate gap adjustment can be made by a plurality of adjusting mechanisms for the distance of the tiny gap 50. If such adjusting mechanisms are unnecessary, they can be omitted. The flange surface 56 of the moving mechanism 51 is separated from the sample moving mechanism 51 for an easier understanding of the construction of the present invention; needless to say, it can be constructed as integral to the sample moving mechanism 51.

By the way, the sample stage of a conventionally feasible electron beam patterning apparatus presents with an altitudinal displacement of about 10 μm within the movement range of about 6 inches.

In the system of the presently claimed apparatus as shown in the present invention, therefore, if the shaft diameter of the actuator 45 for sample movement is set at 20 mm, and the driven range of the sample moving mechanism 51 at ±1 inch (±25.4 mm) in each of the X and Y axial directions, then the tiny gap 50 determining the conductance of interest can be adjusted to about 0.15 mm. If the width of the tiny gap 50 is assumed to be 10 mm, the venting conductance of the tiny gap 50 partitioning the sample chamber 4 and the stage chamber 5 will be approximately C=0.33 liter/sec. Hence, it is also possible that while the degree of vacuum of the stage chamber 5 where the sample moving mechanism 51 is mounted is being kept at about $4 \times 10^{-5}$ Pa, the sample chamber 4 is used in the range of from an ultra-high vacuum of $10^{-7}$ Pa or less to about $10^{-3}$ Pa made by gas introduction. The shape of the open flange of sleeve 43 may be circular or rectangular, since it depends on the moving range of the moving mechanism 51.

In accordance with the foregoing construction, it becomes possible to use on the sample moving mechanism 51 a vacuum-resistant grease or oil with a low vapor pressure which is used in conventional electron beam or ion beam devices. The construction as described in the aforementioned embodiment also eliminates the need for exposing the sample stage or the laser interference mirror portion to high temperatures during baking, thus permitting highly stable, highly accurate measurements by comparator. In order to minimize influence from baking or gas introduction, as in the instant embodiment, the laser interferometer and laser interference mirror can be mounted at a heat-insulated position or a position affected minimally by gas from the tiny gap. Errors in Abbe number due to differences between the position as directly measured by laser and the actual position of the sample can be corrected by measuring, beforehand, the sample pattern written or the altitudinal displacement. For the materials of the sample holder 41 and the shaft 42 which need baking, there can be employed alumina ceramics, silicon carbide or quartz with a small coefficient of thermal expansion, titanium with corrosion resistance, or the like.

In the embodiment illustrated in FIG. 2, the case of the electron beam writing apparatus was described; however, the invention can be carried out likewise for a fine patterning device or a maskless processing device using a focused ion beam by mounting an ion beam optical column instead of the electron-optical column 3 of FIG. 2. The invention can also be practiced for a scanning electron microscope (SEM), a scanning Auger electron microscope (SAM), an ion microprobe mass analyzer (IMMA), and an expanded X-ray absorption edge fine structure analyzer (EXAFS), which require sample surface treatment or analysis/assessment under an ultra-high vacuum.

With microscopic devices, the range of movement of the sample moving mechanism is narrow compared with electron beam writing devices, thus diminishing the opening size of the open flange, and consequently simplifying the structure of the device.

According to the present invention, as described above, the following effects can be achieved with a charged beam apparatus for performing fine fabrication, formation of a semiconductor lithographic pattern, or analysis/assessment, using a charged beam: A gap defined by concentric flat surfaces is formed between a sample chamber requiring an ultra-high vacuum or designed for gas introduction, and a vacuum chamber difficult to keep under an ultra-high vacuum or difficult to expose to gas; the respective chambers with different degrees of vacuum are maintained at desired degrees of vacuum by a small venting conductance created by this gap; and maintenance of an ultra-high vacuum and no exposure to gases can coexist with the driving of a built-in structure requiring a high accuracy or having a high grade function, such as a sample moving mechanism.

The present invention has been described in detail with respect to preferred embodiments, and it will now be clear that changes and modifications may be made without departing from the invention in its broader aspects, and it is our intention, therefore, in the appended claims to cover all such changes and modifications as fall within the true spirit of the invention.

What is claimed is:

1. A charged beam apparatus comprising:

an electron-optical column having a charged beam source for producing a charged beam, and an optical system for focusing the charged beam on a sample;

a sample chamber in which the sample is placed, the sample chamber being connected communicatingly with the electron-optical column;

a vacuum chamber connected communicatingly with the sample chamber;

a sleeve disposed between the sample chamber and the vacuum chamber, the sleeve having a flange with a flat open surface facing the vacuum chamber;

a sample moving mechanism disposed in the vacuum chamber, the sample moving mechanism having a moving flat surface which faces the flat open surface of the flange, there being a tiny gap between the flat open surface of the flange and the flat surface of the sample moving mechanism, the sample moving mechanism being movable in a direction parallel to the flat open surface of the flange; and a sample holder for holding the sample in the sample chamber, the sample holder being mechanically connected to the moving flat surface of the sample moving mechanism through the sleeve;

wherein the tiny gap is for facilitating differential evacuation between the sample chamber and the vacuum chamber.

2. A charged beam apparatus as claimed in claim 1, wherein the sample chamber is constructed for an ultra-high vacuum.

3. A charged beam apparatus as claimed in claim 1, wherein the sample chamber is constructed for a corrosive gas atmosphere.

4. A charged beam apparatus comprising:

an electron-optical column having a charged beam source and an optical system for focusing the charged beam to a sample;

a sample chamber in which said sample is placed, and being connected communicatedly with said electron-optical column;

a vacuum chamber being connected communicatedly with said sample chamber;

a sleeve being mounted on a connecting portion between said sample chamber and said vacuum chamber and having a flange with a flat open surface which is opposed to said vacuum chamber side;

a sample moving mechanism being mounted in said vacuum chamber, and having a moving flat surface which is opposed to said flat open surface with a tiny gap and is capable of moving in a direction parallel to said flat open surface; and a sample holder for holding said sample being placed in said sample chamber and being connected mechanically to said moving flat surface of said sample moving mechanism through said sleeve;

wherein said tiny gap is the gap that is capable of performing differential evacuating between said sample chamber and said vacuum chamber.

5. A charged beam apparatus as claimed in claim 4, wherein the sample chamber is constructed for an ultra-high vacuum.

6. A charged beam apparatus as claimed in claim 4, wherein the sample chamber is constructed for a corrosive gas atmosphere.

* * * * *

UNITED STATES PATENT AND TRADEMARK OFFICE
CERTIFICATE OF CORRECTION

PATENT NO. : 5,493,125
DATED : February 20, 1996
INVENTOR(S) : Shigeo Okayama; Mutsuo Ogura; Masanori Komuro; and Hiroshi Hiroshima It is certified that error appears in the above-indentified patent and that said Letters Patent is hereby corrected as shown below:

On title page, under item [56],
Primary Examiner--Bruce C. Anderson, please add:
--Attorney, Agent, or Firm--Spencer & Frank--.

Signed and Sealed this

Twelfth Day of November, 1996

Attest:

BRUCE LEHMAN

*Attesting Officer*    *Commissioner of Patents and Trademarks*